(12) United States Patent
Nam et al.

(10) Patent No.: US 8,887,631 B2
(45) Date of Patent: Nov. 18, 2014

(54) PATTERN TRANSCRIPTION DEVICE AND METHOD OF FABRICATING CLICHE FOR THE SAME

(75) Inventors: Seung-Hee Nam, Gyeonggi-do (KR); Soon-Sung Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1267 days.

(21) Appl. No.: 12/003,623

(22) Filed: Dec. 28, 2007

(65) Prior Publication Data

US 2008/0190307 A1 Aug. 14, 2008

(30) Foreign Application Priority Data

Feb. 14, 2007 (KR) .................. 10-2007-0015264

(51) Int. Cl.
*B41C 1/02* (2006.01)
*B41F 1/16* (2006.01)
*B82Y 10/00* (2011.01)
*B82Y 40/00* (2011.01)
*G03F 7/00* (2006.01)

(52) U.S. Cl.
CPC . *B41F 1/16* (2013.01); *B82Y 10/00* (2013.01); *B82Y 40/00* (2013.01); *G03F 7/0002* (2013.01)
USPC ....................... 101/401.1; 101/217

(58) Field of Classification Search
None
See application file for complete search history.

(56) References Cited

U.S. PATENT DOCUMENTS

| | | | |
|---|---|---|---|
| 6,300,042 B1 * | 10/2001 | Mancini et al. | 430/325 |
| 2006/0091106 A1 * | 5/2006 | Kim | 216/41 |
| 2007/0048667 A1 * | 3/2007 | Yoo et al. | 430/302 |

FOREIGN PATENT DOCUMENTS

| | | | |
|---|---|---|---|
| JP | 2005308954 A | * | 11/2005 |
| KR | 1020060066309 A | | 6/2006 |

OTHER PUBLICATIONS

KR Office Action issued Feb. 19, 2013.

* cited by examiner

*Primary Examiner* — Joshua D Zimmerman
(74) *Attorney, Agent, or Firm* — Morgan, Lewis & Bockius LLP

(57) ABSTRACT

A pattern transcription apparatus comprises a cliché including a concave portion, a convex portion and a printing stopper, the printing stopper formed in the concave portion; and a blanket, on which a resist material layer is coated, rotatable on the cliché, wherein edges of the printing stopper protruding from the printing stopper to have a height greater than a top surface of the convex portion.

5 Claims, 10 Drawing Sheets

PATTERN TRANSCRIPTION DEVICE AND METHOD OF FABRICATING CLICHE FOR THE SAME

The present application claims the benefit of Korean Patent Application No. 2007-0015264 filed in Korea on Feb. 14, 2007, which is hereby incorporated by reference in its entirety.

BACKGROUND OF THE INVENTION

1. Field of the Invention

The present invention relates to a pattern transcription device, and more particularly, to a transcription device and a method of fabricating a cliche for the pattern transcription device being capable of forming a fine pattern without damages on the pattern.

2. Discussion of the Related Art

A flat panel display device, such as a liquid crystal display (LCD) device, includes a thin film transistor (TFT) as a switching element in each pixel. A fabricating process of the TFT requires many mask processes including a process of forming a photoresist pattern (PR). The PR pattern has a great effect on characteristics of the TFT. Characteristics of the TFT are the subject of significant research and development. Particularly, significant efforts have been devoted to improve characteristics of the TFT using a fine metal pattern.

Generally, a fabricating process of the PR pattern includes a step of forming a PR layer by coating a photosensitive PR material, a step of exposing the PR layer using a mask and a step of developing the exposed PR layer to form the PR pattern. However, since many process steps for fabricating the PR pattern, which are very complicated, are required to fabricate the TFT, production costs increase and production yield decreases.

Figure 1A:
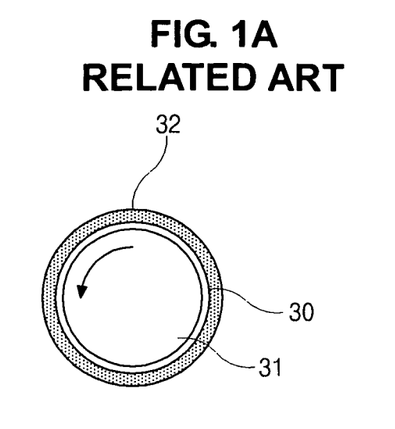
FIGS. 1A to 1D show a process of fabricating a resist pattern by a conventional reverse offset method.

To resolve these problems, a method of fabricating a resist pattern using a printing method is suggested. FIGs. 1A to 1D show a process of fabricating a resist pattern by a conventional reverse offset method. First, as shown in FIG. 1A, a resist material layer 32 is coated on an outer surface of a blanket 30. The blanket 30 covers along a circumference of a roller 31. The blanket 30 has a circumference being substantially the same as a length of a substrate, on which a resist pattern is to be formed.

Figure 1B:
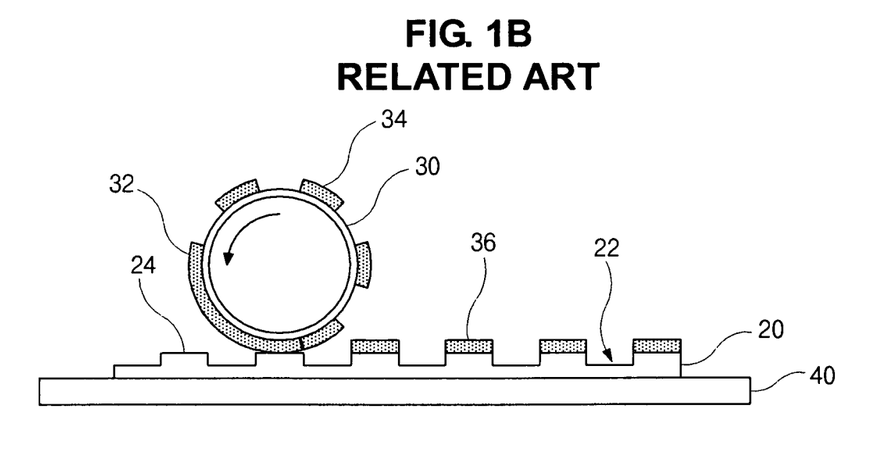

Next, as shown in FIG. 1B, the blanket 30, on which the resist material layer 32 is coated, is rotated on a cliché 20 on a printing table 40. The cliché 20 includes a plurality of concave portions 22 and a plurality of convex portions 24 to resulting in an uneven surface. Each convex portion 24 is disposed between two adjacent concave portions 22. When the roller 31 is rotated on the cliché 20, a concave-counter pattern 34 is formed on the blanket 30 and a convex-counter pattern 36 is formed on the convex portion 24 because the resist material has a greater adhesive strength to the cliché 20 than the blanket 30. Namely, portions of the resist material layer 32 corresponding to the convex portion 24 are transferred on the convex portion 24, and the other portions of the resist material layer 32 corresponding to the concave portion 22 remain on the blanket 30, thereby forming the concave-counter pattern 34 on the blanket 30.

Figure 1C:
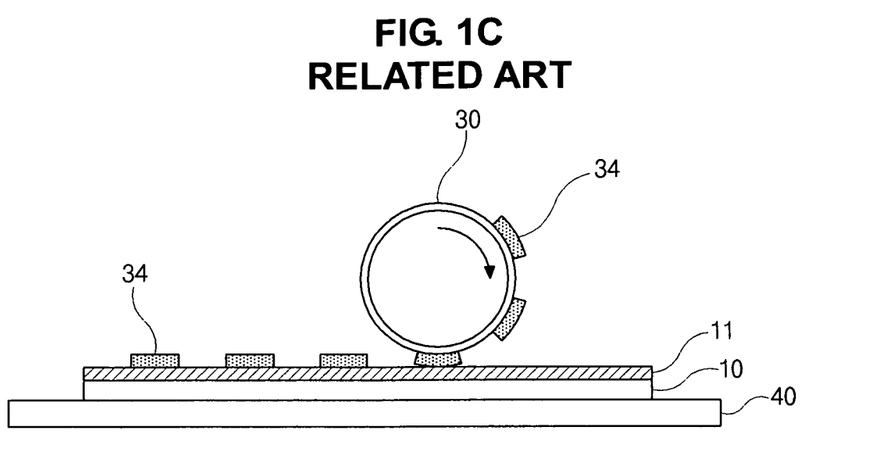
Figure 1D:
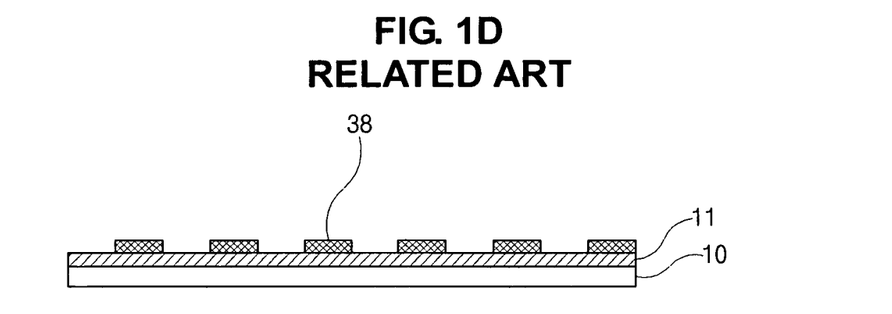

Next, as shown in FIG. 1C, the blanket 30 including the concave-counter pattern 34 contacts and is rotated on a process-object layer 11 disposed on a substrate 10. Then, the concave-counter pattern 34 is transferred on the process-object layer 11. By applying UV light to the concave-counter pattern 34 and hardening it, a resist pattern 38 is formed on the process-object layer 11, as shown in FIG. 1D.

Figure 2A:
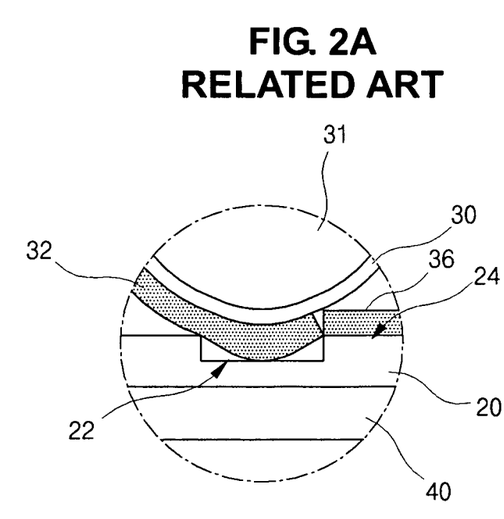
FIG. 2A is an enlarging view showing a concave portion contacting a resist material.
Figure 2B:
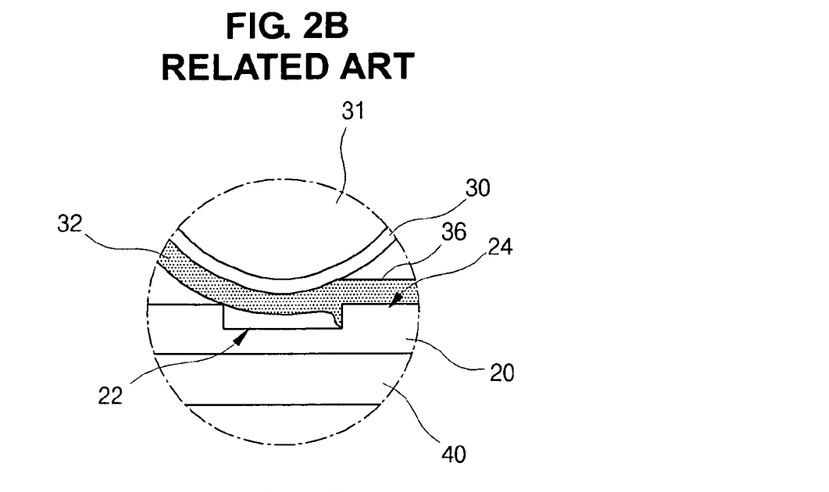
FIG. 2B is an enlarging view showing a concave portion contacting a resist material
Figure 2C:
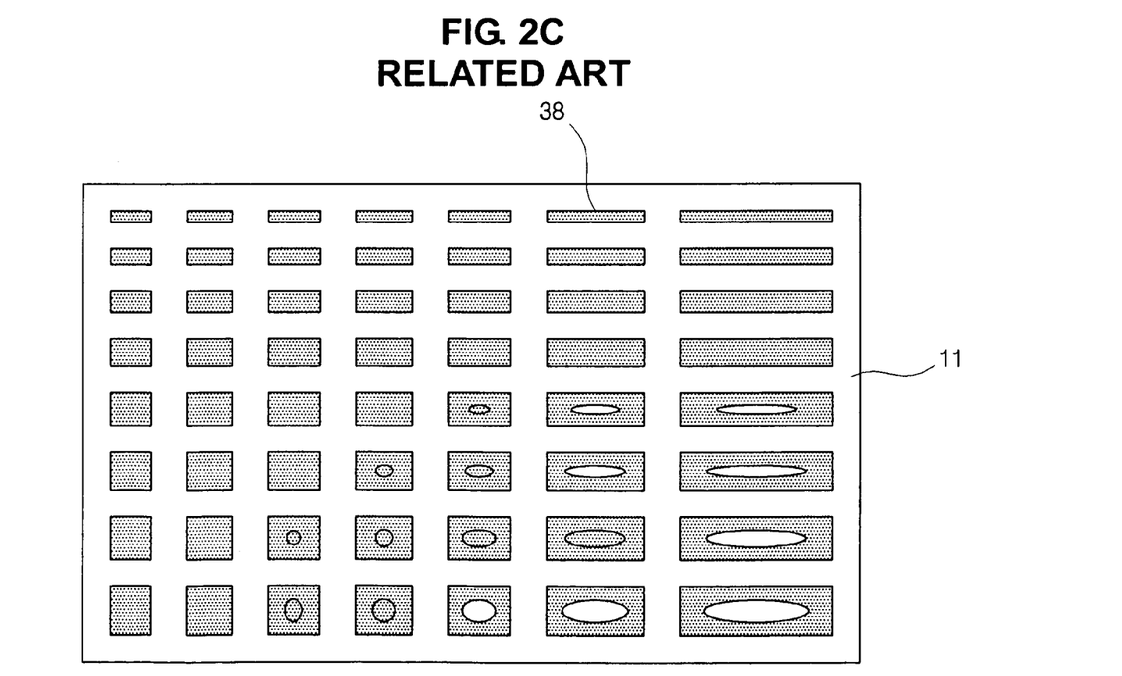
FIG. 2C is a plane perspective view showing a process-objected layer having an undesired resist pattern.

Generally, the blanket 30 is formed of an elastic material, such as silicon or rubber. Accordingly, when the blanket 30 is rolled on the cliché 20, the blanket 30 is crushed and contacts a bottom surface of the concave portion 22 of the cliché 20 because of it's an elastic property, as shown in FIG. 2A, such that the resist material is partially stuck to the bottom surface of the concave portion 22 and the desired remained pattern 38 (of FIG. 1D) can not be obtained. In addition, when the blanket 30 is rolled on the cliché 20 and contacts a board between the concave portion 22 and the convex portion, the resist material layer 32 flows into the concave portion 22, as shown in FIG. 2B. Consequently, there are some undesired resist patterns on the process-object layer 11, as shown in FIG. 2C. These problems are easily caused as the resist pattern 38 is large in size.

To resolve these problems, it is possible to form the concave portions more deep so as not to contact the blanket with the bottom surface of the concave portions. However, when the concave portion has a greater depth, there are losses on a critical dimension. The concave portion is formed by a wet-etching, which has isotropic properties, using an etchant. The greater depth the concave portion has, the greater width the concave portion has. Namely, the width is proportional to the depth. It is difficult to form a fine pattern with a great width.

SUMMARY OF THE DISCLOSURE

Accordingly, the present invention is directed to a patterning transcription device and method of fabricating a cliché for the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a pattern transcription apparatus comprises a cliché including a concave portion, a convex portion and a printing stopper, the printing stopper formed in the concave portion; and a blanket, on which a resist material layer is coated, rotatable on the cliché, wherein edges of the printing stopper protruding from the printing stopper to have a height greater than a top surface of the convex portion.

In another aspect of the present disclosure, a method of fabricating a cliché for a pattern transcription apparatus comprises forming a metal pattern on a substrate; etching the substrate using the metal pattern as an etching mask to form a concave portion and a convex portion; and forming a printing stopper in the concave portion, wherein edges of the printing stopper protruding from at least one of the convex portion and the printing stopper.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the embodiments, examples of which are illustrated in the accompanying drawings.

Figure 3:
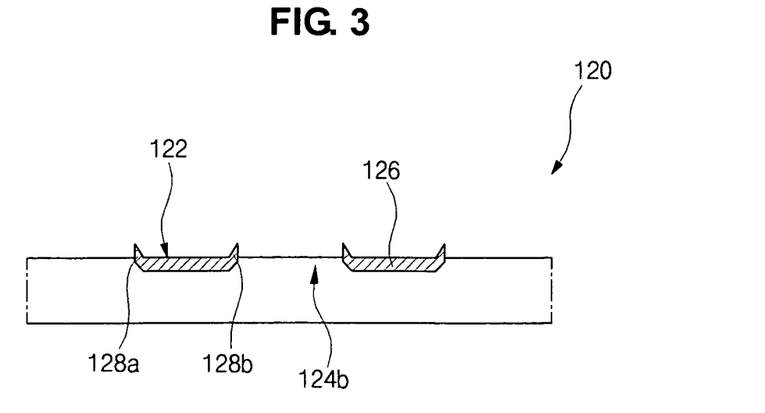
FIG. 3 is a perspective cross-sectional view of a cliché according to an embodiment of the present invention.

FIG. 3 is a perspective cross-sectional view of a cliché according to an embodiment of the present invention. In FIG. 3, a cliché includes a plurality of concave portions 122, a plurality of convex portions 124 between adjacent concave portions 122, and a printing stopper 126 in each of the concave portions 122. A top the printing stopper 126 and a top of the convex portion 124 make an even surface. Namely, the convex portion 124 protrudes from a bottom surface of the concave portion 122 by a thickness of the printing stopper 126.

Figure 4A:
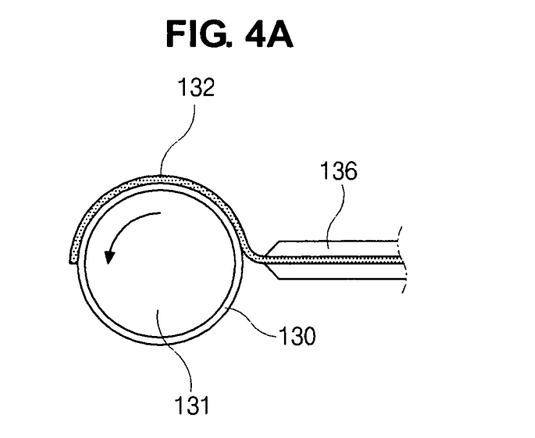
FIGS. 4A to 4D show a process of fabricating a resist pattern by a reverse offset method according to an embodiment of the present invention.

Referring to FIGS. 3 and 4A, the printing stopper 126 is formed of a material having a surface energy density smaller than that of a blanket 130. For example, the printing stopper 126 is formed of Teflon™. First and second edges 128a and 128b of the printing stopper 126 protrudes from the top surface of the printing stopper 126. Namely, each of the first and second edges 128a and 128b has a height greater from a bottom surface of the cliché 120 than both the printing stopper 126 and the convex portion 124. Each of the first and second edges 128a and 128b has a height from the top surface of the printing stopper 126 about ½ to about ⅓ of a thickness of a resist material layer 132 coated on an outer surface of the blanket 130. A fine pattern is obtained due to the first and second edges 128a and 128b. It is explained with reference to FIGS. 4A to 4D.

FIGS. 4A to 4D show a process of fabricating a resist pattern by a reverse offset method according to an embodiment of the present invention. First, as shown in FIG. 4A, a blanket 130 covers along a circumference of a roller 131, and a resist material layer 132 is coated on an outer surface of the blanket 130. When the blanket 130 with roller 131 is rotated, a resist supplier 136 supplies a resist material to the outer surface of the blanket 130 such that the resist material layer 132 is uniformly formed on the outer surface of the blanket 130.

Figure 4B:
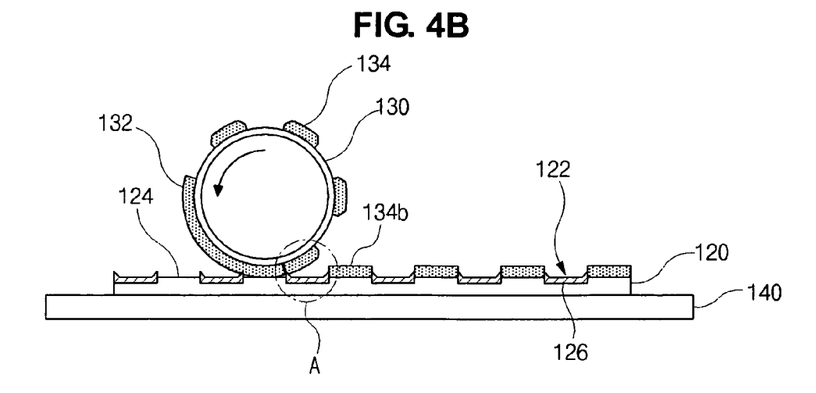

Next, as shown in FIG. 4B, the blanket 130, on which the resist material layer 132 is coated, contacts and is rotated on a cliché 120 formed on a printing table 140. As explained with FIG. 3, the cliché 120 includes the plurality of concave portions 122 and the plurality of convex portions 124. Each convex portion 124 is disposed between two concave portions 122. Each of the concave portions 122 corresponds to a pattern that is desired to be formed on a substrate. In addition, the printing stopper 126 is formed in each concave portion 122 to prevent the resist material being printed on the concave portions 122. The central top surface of the printing stopper 126 has substantially the same height from a bottom surface of the cliché 120 as the convex portion 124. On the other hand, edges of the printing stopper 126 protrude from the top surface of the printing stopper 126. Namely, the edges of the printing stopper 126 have a height greater than a top surface of the convex portion 124. A material of the blanket 130 has a surface energy density with a range between 20 mJ/cm² and 23 mJ/cm², while a material of printing stopper 126, such as Teflon™, has a surface energy density with a range between 13 mJ/cm² and 18 mJ/cm². In brief, a material of the printing stopper 126 has a surface energy density smaller than a material of the blanket 130. This means that the resist material is much stickier with respect to the blanket 130 than the printing stopper 126. Namely, the resist material has a first adhesive strength to the blanket 130 and a second adhesive strength, smaller than the first adhesive strength, to the printing stopper 126. Moreover, the resist material has a third adhesive strength to the cliché 120. The third adhesive strength is greater than the first and second adhesive strengths. Namely, a surface energy density of the blanket 130 is greater than that of the printing stopper 126 and smaller than that of the cliché 120. Accordingly, when the blanket 130 contacts and is rotated on the cliché 120, a convex-counter pattern 134b is formed on the convex pattern 124 and a concave-counter pattern 134 is formed on the blanket 130. Namely, since the resist material layer 132 is much stickier to the cliché 120 than the blanket 130, the resist material layer 132 on the blanket 130 is transferred to the convex portions 124 to form the convex-counter pattern 134b on the convex portion 124 when the resist material layer 132 contacts the cliché 120. However, since the resist material layer 132 is much stickier to the blanket 130 than the printing stopper 126, the resist material layer 132 on the blanket 130 is never transferred to the printing stopper 126 even if the resist material layer 132 contacts the cliché 120. Accordingly, the concave-counter pattern 134 is formed on the blanket 130.

Figure 5:
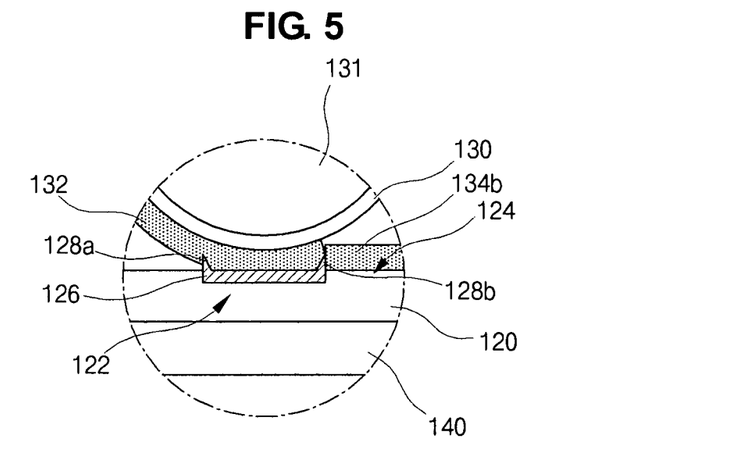
FIG. 5 is an enlarged view showing an "A" region of FIG. 4B.

In this case, as shown in FIG. 5, which is an enlarged view showing an "A" region of FIG. 4B, the edges 128a and 128b protrude from a central top surface of the printing stopper 126. The protruding portion of the edges 128a and 128b has a height about ½ to about ⅓ of a thickness of the resist material layer 132. The edges 128a and 128b is disposed at boundaries between the concave and convex portions 122 and 124. Due to the edges 128a and 128b, both the convex-counter pattern 134b and the concave-counter-pattern 134 are formed to have a desired fine pattern.

Figure 4C:
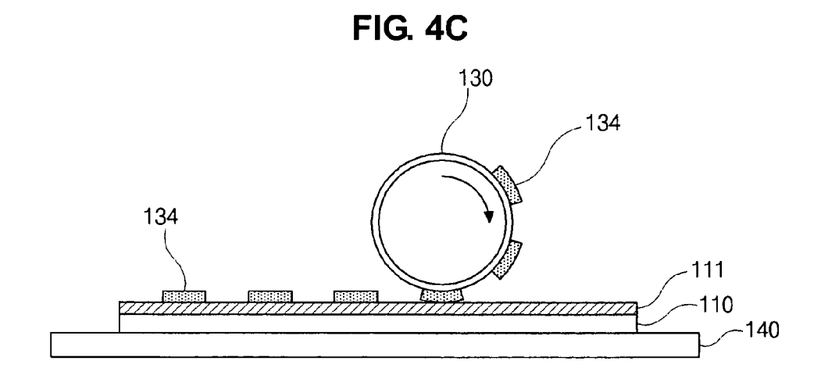

Next, as shown in FIG. 4C, the blanket 130 having a plurality of concave-counter patterns 134 contacts and rotated on a process-object layer 111 to from the plurality of concave-counter patterns 134 on the process-object layer 111 on a substrate 110. Since the resist material is much stickier to the process-object layer 111 than the blanket 130, the concave-counter patterns 134 on the blanket 130 are transferred onto the process-object layer 111 when the concave-counter patterns 134 contacts the process-object layer 111. Since a circumference of the blanket 130 is substantially the same as a length of the substrate 110, the plurality of concave-counter patterns 134 on the blanket 130 are wholly transferred onto the process-object layer 111 by a single rotation.

Figure 4D:
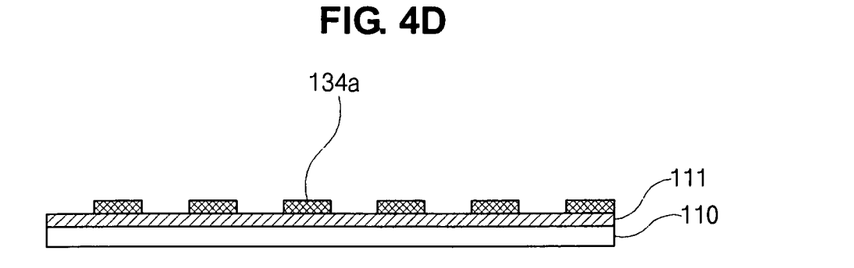

Next, the concave-counter patterns 134 on the process-object layer 111 is irradiated by UV light and hardened to form resist patterns 134a on the process-object layer 111.

The process-object layer 111 may be one of a metal layer, from which metal patterns, e.g., a gate electrode, a source electrode and a data electrode of a thin film transistor (TFT), are formed, and an insulating layer including one of silicon oxide and silicon nitride. The process-object layer 111 may be etched using the resist patterns 138 as an etching mask to form the metal patterns or a contact hole in the insulating layer.

As explained above, since the printing stopper 126, which is less sticky to the resist material than the blanket 130, is formed on the concave portions 122 of the clicke 120, the resist material is never transferred to the concave portions 122 even if the resist material on the blanket 130 contacting printing stopper 126. Moreover, since the edges 128a and 128b of the printing stopper 126 protrude from the central top surface of the printing stopper 126, it is prevented the resist material flowing into the concave portion 122. Accordingly, a desired concave-counter pattern 134 is formed on the blanket 130 without a sticky portion on the printing stopper 126. The problem in the related art is improved.

Figure 6A:
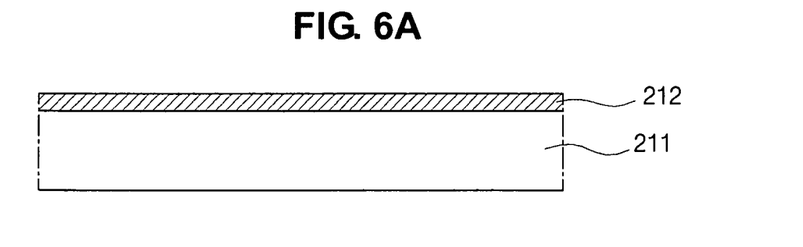
FIGS. 6A to 6G are cross-sectional views showing a process of fabricating a cliché according to an embodiment of the present disclosure.
Figure 6B:
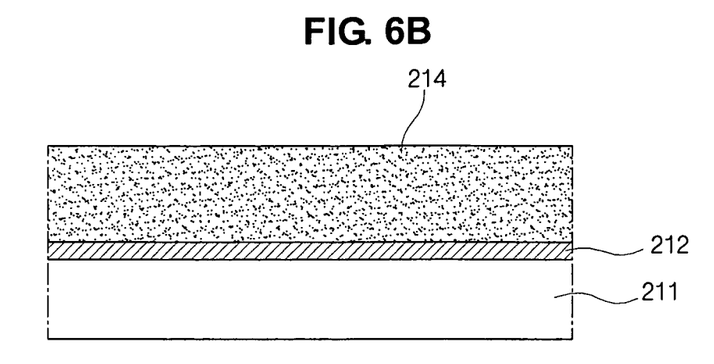
Figure 6C:
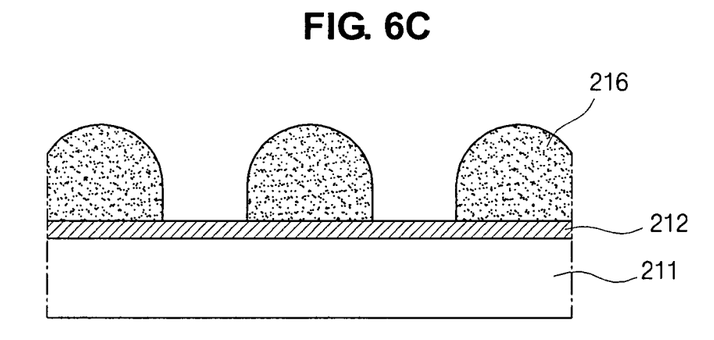

FIGS. 6A to 6G are cross-sectional views showing a process of fabricating a cliché according to an embodiment of the present disclosure. As shown in FIG. 6A, a metal layer 212 is formed on a substrate 211 by depositing at least one metallic material selected from a metal group including molybdenum (Mo), chromium (Cr) and nickel (Ni). Next, as shown in FIG. 6B, a photosensitive material layer 214 is formed on the metal layer 212 by depositing a photosensitive material such as photoresist. Next, a mask (not shown) having a transmitting portion and a blocking portion is disposed over the photosensitive material layer 214. The transmitting portion has a relatively high transmittance so that light through the transmitting portion can completely change the photosensitive material layer 214 chemically. The blocking portion shields light completely. Namely, a transmittance of the transmitting portion is greater than that of the blocking portion. When the photosensitive material is a positive type, the blocking portion of the mask corresponds to a position that is desired to form a convex portion, and transmitting portion of the mask corresponds to a position that is desired to form a concave portion. If the photosensitive material is a negative type, locations of the blocking and transmitting portions of the mask are changed into each other. Then, the photosensitive material layer 214 is exposed through the mask (not shown) and developed to form a photosensitive material pattern 216, as shown in FIG. 6C.

Figure 6D:
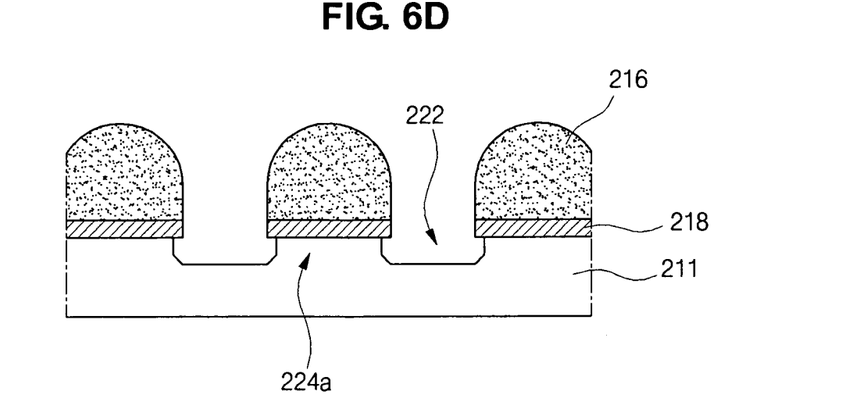
Figure 6E:
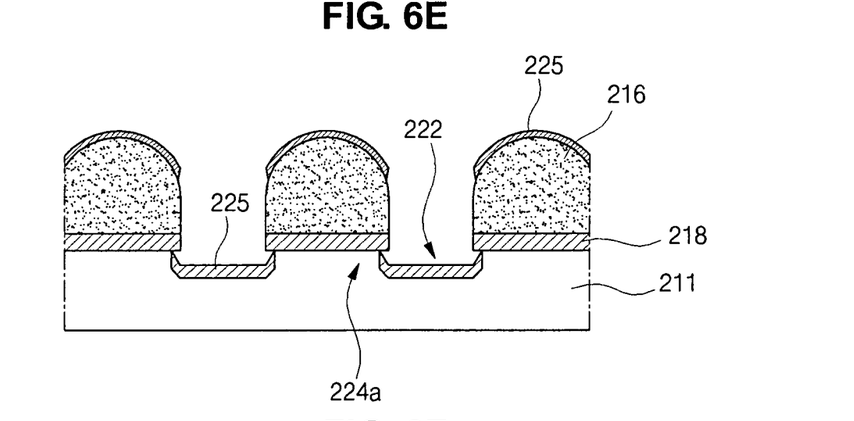

Next, as shown in FIG. 6D, the metal layer 212 (of FIG. 6C) exposed through the photosensitive material patterns 216 is etched using the photosensitive material pattern 216 as an etching mask to form a metal pattern 218. The metal pattern 218 corresponds to the photosensitive material pattern 216. And then, the substrate 211 exposed through the metal patterns 218 is etched using the metal pattern 218 as an etching mask to form a plurality of concave portions 222. Moreover, since the substrate 211 is etched to form the plurality of concave portions 222, other portions of the substrate 211 protrude. The protruding portions are defined as a plurality of convex patterns 224a. Next, as shown in FIG. 6E, a low surface energy density material layer 225 is formed on the substrate 211 including photosensitive material pattern 216. The low surface energy density material layer 225 is formed on both the photosensitive material pattern 216 and a bottom surface of the concave portions 222. The low surface energy density material layer 225 is formed on not only the bottom surface of the concave portion 222 but also a side wall of the concave portion 222. A height of the low surface energy density material layer 225 in the side wall from a bottom surface of the substrate 211 is higher than that in a central top surface. Namely, the side wall of the low surface energy density material layer 225 has the same height as the convex pattern 224a, while the central top surface of the low surface energy density material layer 225 has a lower height than the convex pattern 224a. The low surface energy density material layer 225 may include Teflon™.

Figure 6F:
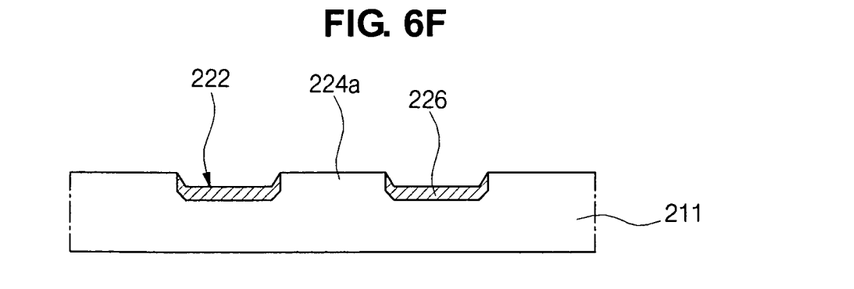

Next, the photosensitive material pattern 216 and the metal pattern 218 are removed from the substrate 211. The low surface energy density material layer 225 on the bottom surface of the concave portions 222 is defined as a printing stopper 226, as shown in FIG. 6F.

Figure 6G:
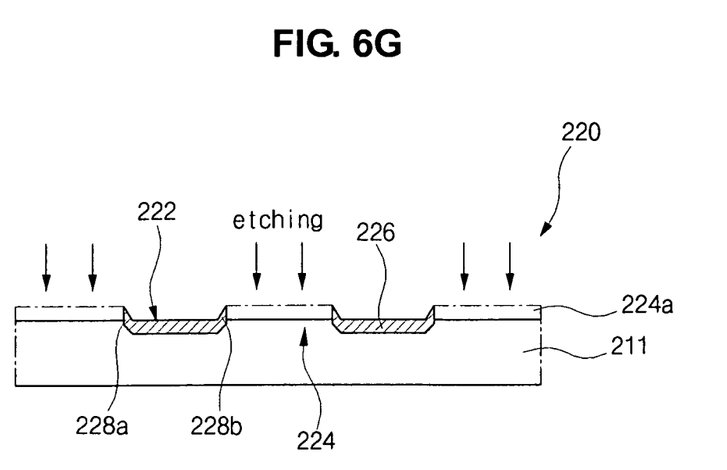

Next, as shown in FIG. 6G, the convex patterns 224a (of FIG. 6F) is selectively etched. A portion of the convex patterns 224a after being selectively etched is defined as a convex portion 224. As a result, a central top surface of the printing stopper has the same height as the convex portion 224. While, edges 228a and 228b of the printing stopper 226 protrude from both the central top surface of the printing stopper and the convex portion 224. The substrate 211 including the plurality of concave portions 222, the plurality of convex portions 224 and the printing stopper 226 with the edges 228a and 228b protruding from the central top surface of the printing stopper 226 is called a cliché 220.

On other hand, a cliché may be formed without a metal layer 212 (of FIG. 6A) to decrease a process time and increase production yield. However, since a photosensitive material layer 214 (of FIG. 6B) has a poor adhesive strength to the substrate 211 (of FIG. 6A) of glass, it is difficult to obtain a fine pattern without the metal layer 212 (of FIG. 6A).

In the present invention, a cliché includes a printing stopper of a low surface energy density material in a concave portion. Moreover, edges of the printing stopper protrude from a top surface of the printing stopper. By these features, desired resist patterns are obtained.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a cliché for a pattern transcription apparatus, comprising:
   forming a metal pattern on a substrate;
   etching the substrate using the metal pattern as an etching mask to form a concave portion and a convex portion;
   depositing a low surface energy density material layer to cover the entire surface of the substrate including the concave portion and the convex portion;
   using the low surface energy density material layer inside the concave portion to form a printing stopper, wherein the printing stopper is formed with a center top surface and two protruding edges protruding from edges of the center top surface, and wherein the two protruding edges have a same height as the convex portion, the center top surface has a lower height than the convex portion; and
   partially etching the substrate in the convex portion using the printing stopper as a second etching mask such that the center flat top surface has a same height as the convex portion and the two protruding edges have a greater height than the convex portion.

2. The method according to claim 1, wherein the step of forming the printing stopper comprise:

forming the surface energy density material layer on both a bottom surface and a sidewall of the concave portion, wherein the low surface energy density material layer in the sidewall has a height higher than a central top surface of the low surface energy material; and removing the metal pattern and the low surface energy density material layer on the metal pattern to form the printing stopper and expose the substrate in the convex portion.

3. The method according to claim 2; wherein the low surface energy density material layer includes Teflon™.

4. The method according to claim 1, wherein the step of forming the metal pattern comprises:

forming a metal layer on the substrate;

forming a photosensitive material pattern on the metal layer; and etching the metal layer using the photosensitive material pattern as a third etching mask to form the metal pattern.

5. The method according to claim 4, the metal layer includes at least one of molybdenum (Mo), chromium (Cr) and nickel (Ni).

\* \* \* \* \*